(12) United States Patent
Adams

(10) Patent No.: US 8,937,978 B2
(45) Date of Patent: Jan. 20, 2015

(54) SEMICONDUCTOR LASER

(75) Inventor: Alf Adams, Guildford (GB)

(73) Assignee: University of Surrey, Guildford, Surrey (GB)

( * ) Notice: Subject to any disclaimer, the term of this patent is extended or adjusted under 35 U.S.C. 154(b) by 0 days.

(21) Appl. No.: 14/116,445

(22) PCT Filed: May 9, 2012

(86) PCT No.: PCT/GB2012/051019
§ 371 (c)(1),
(2), (4) Date: Feb. 12, 2014

(87) PCT Pub. No.: WO2012/153136
PCT Pub. Date: Nov. 15, 2012

(65) Prior Publication Data
US 2014/0146837 A1  May 29, 2014

(30) Foreign Application Priority Data

May 9, 2011 (GB) .................................. 1107674.2

(51) Int. Cl.
*H01S 5/00* (2006.01)
*H01S 5/32* (2006.01)
*B82Y 20/00* (2011.01)
*H01S 5/34* (2006.01)
*H01S 5/183* (2006.01)
*H01S 5/343* (2006.01)

(52) U.S. Cl.
CPC ................ *H01S 5/321* (2013.01); *B82Y 20/00* (2013.01); *H01S 5/3216* (2013.01); *H01S 5/3407* (2013.01); *H01S 5/34* (2013.01); *H01S 5/183* (2013.01); *H01S 5/3213* (2013.01); *H01S 5/34333* (2013.01)
USPC ...... 372/29.021; 372/31; 372/34; 372/45.012

(58) Field of Classification Search
None
See application file for complete search history.

(56) References Cited

U.S. PATENT DOCUMENTS 4,861,976 A * 8/1989 Jewell et al. ..................... 257/21
5,544,188 A * 8/1996 Takiguchi et al. ......... 372/45.01
(Continued)

OTHER PUBLICATIONS

Herve, Denis; PCT International Search Report from International Patent Application No. PCT/GB2012/051019; Oct. 2, 2012; pp. 1-4; European Patent Office as the International Searching Authority; European Patent Office; Netherlands.
(Continued)

*Primary Examiner* — Armando Rodriguez
*Assistant Examiner* — Sean Hagan
(74) *Attorney, Agent, or Firm* — Sheridan Ross P.C.

(57) ABSTRACT

A semiconductor laser has an optical cavity comprising and active layer disposed between an n-side barrier layer and a p-side barrier layer. The active layer comprises alternating layers of a first and second material, and the n-side barrier layer and p-side barrier layer each comprise alternating layers of the first material and a third material. The materials are selected such that the layers of the second and third materials form quantum wells between the layers of the first material. A band gap Eg of the second material is arranged such that a proportion of electrons and holes that recombine across the band gap Eg recombine to emit photons at the lasing wavelength, the proportion decreasing with increasing temperature of the optical cavity. A band gap Ec of the third material is arranged such that a ratio of electrons and holes that recombine across the band gap Eg of the second material to electrons and holes that recombine across the band gap Ec of the third material increases with increasing temperature of the optical cavity. Over a range of temperatures at which the semiconductor laser is intended to operate, the increasing ratio compensates for the decreasing proportion so as to reduce change with temperature of the optical cavity in the rate at which electrons and holes recombine across the band gap Eg of the second material to emit photons at the lasing wavelength.

21 Claims, 8 Drawing Sheets

(56) References Cited

U.S. PATENT DOCUMENTS

| | | |
|---|---|---|
| 5,790,578 A | 8/1998 | Takano |
| 6,879,612 B1 * | 4/2005 | Wasserbauer ............... 372/50.1 |
| 2003/0197188 A1 | 10/2003 | Watatani et al. |
| 2006/0086932 A1 | 4/2006 | Kim et al. |

OTHER PUBLICATIONS

Herve, Denis; PCT written Opinion of the International Searching Authority from International Patent Application No. PCT/GB2012/051019; Oct. 2, 2012; pp. 1-6; European Patent Office, Munich, Germany.

* cited by examiner

SEMICONDUCTOR LASER

CROSS REDERENCE TO RELATED APPLICATIONS

The present application is a National Phase Application of International Application No. PCT/GB2012/051019 field May 9, 2012, which claims priority to Great Britain Patent Application No. 1107674,2 field May 9, 2011, which applications are incorporated herein fully by this reference.

FIELD OF THE DISCLOSURE

The present disclosure relates to a semiconductor laser.

BACKGROUND TO THE DISCLOSURE

One problem in semiconductor lasers is that the threshold current $I_{th}$ required for them to reach their lasing threshold increases strongly with increasing temperature. Also, the rate of increase of the optical power of light output by a semiconductor laser above its lasing threshold with increasing input current, called slope efficiency, decreases with increasing temperature. Thus, if the current supplied to a semiconductor laser is kept constant, the power of light output by the laser drops considerably as its temperature increases. These effects are caused by intrinsic processes such as the thermal broadening of the gain spectrum, non-radiative Auger recombination and Inter-valence Band Absorption. Removal of these processes has defied more than thirty years of expensive research and development. As a result, in many applications, the temperature of a semiconductor laser has to be carefully controlled using large, expensive and power-hungry cooling units, and/or the current supplied to a semiconductor laser has to be carefully controlled to maintain a light output of constant optical power. The cooling units and control circuitry often use an order of magnitude more electrical power than the laser itself.

FIG. 1 shows how the optical power of light output by a conventional 1.5 µm InGaAsP semiconductor laser varies with the input current supplied to the laser at a plurality of different temperatures. The threshold current $I_{th}$ at each temperature is the elbow of the curve, at which the emission of coherent light by the laser begins. Slope efficiency at each temperature represents the change in power of the light output in relation to the change in input current supplied to the laser. Both the threshold current $I_{th}$ and the slope efficiency are sensitive to temperature, and usually particularly so at and around room temperature. It can be seen that the threshold current $I_{th}$ increases with increasing temperature. It can also be seen that for a constant bias current the optical power of the light output decreases with increasing temperature due to both increasing threshold current $I_{th}$ and decreasing slope efficiency. The relationship between optical power of the light output and temperature at a fixed bias current is shown in FIG. 2.

SUMMARY OF THE DISCLOSURE

According a first aspect of the disclosure, there is provided a semiconductor laser operable to output light at a lasing wavelength in response to supply of an electrical current, the semiconductor laser having an optical cavity comprising:

an active region with a first band gap arranged such that a proportion of electrons and holes that recombine across the first band gap recombine to emit photons at the lasing wavelength, the proportion decreasing with increasing temperature of the optical cavity;

and an additional structure with one or more additional band gaps, the first and one or more additional band gaps being arranged such that a ratio of electrons and holes that recombine across the first band gap to electrons and holes that recombine across the one or more additional band gaps increases with increasing temperature of the optical cavity, wherein, over a range of temperatures at which the semiconductor laser is intended to operate, the increasing ratio compensates for the decreasing proportion so as to reduce change with temperature of the optical cavity in the rate at which electrons and holes recombine across the first band gap to emit photons at the lasing wavelength.

By compensating for the decrease with temperature of the proportion of the electrons and holes that recombine across the first band gap which recombine to emit photons at the lasing wavelength, changes in the threshold current and slope efficiency of the laser with temperature can be reduced.

In many applications, the increasing ratio may compensate for the decreasing proportion over the range of temperatures at which the semiconductor laser is intended to operate such that there is substantially no change with temperature of the optical cavity in the rate at which electrons and holes recombine across the first band gap to emit photons at the lasing wavelength. This can allow the threshold current and the slope efficiency to remain constant over the range of temperatures.

In one example, over the range of temperatures at which the semiconductor laser is intended to operate, the increasing ratio compensates for the decreasing proportion so as to reduce change with temperature of the optical cavity in the threshold current at which the electrical current supplied to the semiconductor laser is sufficient to cause lasing in the optical cavity. The increasing ratio may compensate for the decreasing proportion such that there is substantially no change with temperature of the optical cavity in the threshold current. In other words, the laser may be optimised to reduce or eliminate change in the threshold current.

In another example, over the range of temperatures at which the semiconductor laser is intended to operate, the increasing ratio compensates for the decreasing proportion so as to reduce change with temperature of the optical cavity in the optical power of light output by the semiconductor laser when a fixed electrical current is supplied to the semiconductor laser. The increasing ratio may compensate for the decreasing proportion such that there is substantially no change with temperature of the optical cavity in the optical power of light output by the semiconductor laser when the fixed electrical current is supplied to the semiconductor laser. Typically, the fixed electrical current is two or more times greater than the threshold current. In other words, the laser may be optimised to reduce or eliminate change in slope efficiency.

The range of temperatures at which the semiconductor laser is intended to operate may be an entire range of temperatures at which the semiconductor laser is operable to output light as the result of a lasing process. Alternatively, it may be an entire range of temperatures at which it is possible to operate the semiconductor laser due to temperature limitations of a component of the semiconductor laser. However, it may be just part of either of these entire ranges. In a particular example, the range of temperatures at which the semiconductor laser is intended to operate is 20° C. to 85° C. This range may be suitable for commercial purposes. In another example, the range of temperatures at which the semiconductor laser is intended to operate is −40° C. to 120° C. This range may be suitable for military purposes.

At a lower end of the range of temperatures at which the semiconductor laser is intended to operate, the ratio may be 1:1 or less. This helps to ensure that the ratio can increase sufficiently for purposes of the compensation without the overall rate of recombination in the semiconductor laser, and hence the electrical power requirements of the laser, being too high. At a higher end of the range of temperatures at which the semiconductor laser is intended to operate, substantially no electrons and holes may recombine across the one or more additional band gaps. This further helps to minimise the overall rate of recombination in the semiconductor laser, and hence the electrical power requirements of the laser.

The additional structure may be a localised variation in composition of a material of the optical cavity. For example, the additional structure may be a dilute alloy. Additionally or alternatively, the additional structure may be p-type or n-type doped, and/or have a different type or density of defects in comparison to other parts of the optical cavity.

The optical cavity may comprise a barrier region and the additional structure may have an energy depth with respect to the barrier region that is of the same order of magnitude as kT over the range of temperatures at which the semiconductor laser is intended to operate, where k is Boltzmann's constant and T is the temperature of the optical cavity. In another example, the energy depth may be approximately 10 kT. More generally, the energy depth is between kT and 40 kT.

The term "energy depth" is intended to refer to a difference between the energy level found at the edge of the conduction band of one material and the energy level found at the edge of the conduction band of another material. It can equally refer to a difference between the energy level found at the edge of the valance band of one material and the energy level found at the edge of the valance band of another material. Frequently these two differences are not equal. However, for simplicity, we refer to materials having just one energy depth, as although the precise magnitudes of the two differences may not be equal, the same principles generally to apply to both.

The additional structure may comprise one or more quantum wells. The quantum wells may be bounded by barriers, at least one of which barriers provides at least one of the quantum wells with an energy depth relative to that barrier different to the energy depth of that quantum well relative to another of the barriers. Similarly, the active region may comprise one or more quantum wells. The quantum wells of the active region may be bounded by barriers. At least one of the barriers of the active region may provide at least one of the quantum wells of the active region with an energy depth relative to that barrier different to the energy depth of that quantum well with respect to at least one of the barriers bounding the quantum wells of the additional structure. The energy depth relative to the at least one barrier of the active region may be greater than the energy depth relative to the at least one of the barriers bounding the quantum wells of the additional structure. In other examples, it may be less. It is also possible for at least one of the barriers of the active region to provide at least one of the quantum wells of the active region with an energy depth relative to that barrier different to the energy depth of that quantum well with respect to at least another one of the barriers of the active region.

Additionally or alternatively, the additional structure comprises one or more layers of quantum dots.

The optical cavity may comprise any group III-V or group IV semiconductor. In a particular example, it comprises InGaAsP. In other examples, the optical cavity comprises InGaAsP, InGaAsSb or InGaN.

The lasing wavelength may be in the Infrared (IR) range. In particular examples, the lasing wavelength is approximately 0.5 μm, approximately 1.3 μm, approximately 1.55 μm or approximately 3 μm.

Preferred embodiments are described below, by way of example only, with reference to the accompanying drawings.

DESCRIPTION OF THE PREFERRED EMBODIMENTS

Figure 1:
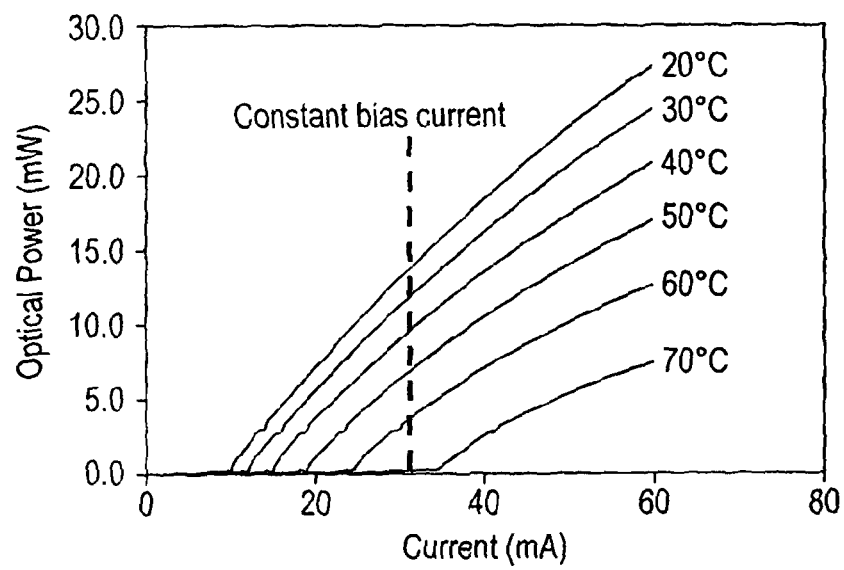
FIG. 1 is a graph showing the relationship between output power and input current for a prior art InGaAsP laser operating at 1.5 μm, at various temperatures over the range 20-70° C.
Figure 2:
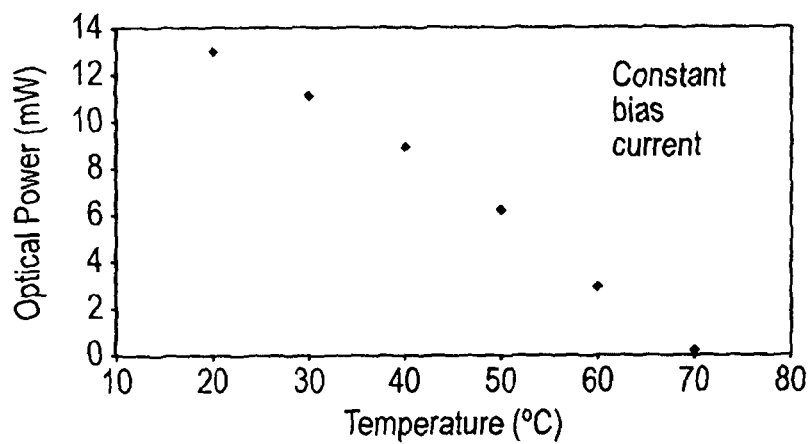
FIG. 2 is a graph showing the temperature dependence of optical power in the prior art InGaAsP laser operating at 1.5 μm.
Figure 3:
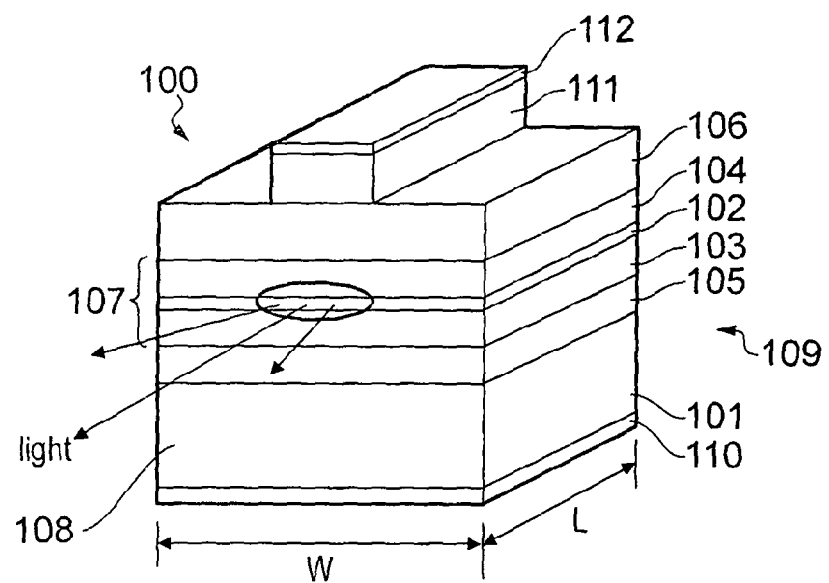
FIG. 3 is a schematic illustration of a laser according to a first preferred embodiment.

Referring to FIG. 3, a laser 100 according to a first preferred embodiment is an edge emitting semiconductor laser and, more specifically, a Separate Confinement Heterostructure (SCH) edge emitting semiconductor laser. It is designed to output light having a wavelength around 1.3 μm (the lasing wavelength λ of the laser 100).

The laser 100 comprises various layers disposed on a substrate 101. An active layer 102 is disposed between an n-side barrier layer 103 and a p-side barrier layer 104. The active layer 102, n-side barrier layer 103 and p-side barrier layer 104 are disposed between first and second cladding layers 105, 106 for confining light within the active layer 102, n-side barrier layer 103 and p-side barrier layer 104. The active layer 102, n-side barrier layer 103 and p-side barrier layer 104, in which light is confined by the first and second cladding layers 105, 106, are together an optical cavity 107.

The dimensions of the optical cavity 107 are such that it is a resonant cavity for light having the lasing wavelength λ. More specifically, the laser 100, and hence the optical cavity 107, has a length L and a width W. The length L is a multiple of λ/2, where λ is the lasing wavelength of the laser 100. Surfaces 108, 109 are provided at each end of the length L of the laser 100 for internally reflecting light in the optical cavity 107. One of the surfaces 108 allows a proportion of light within the active layer 107 to pass, and it is this light that is output by the laser 100.

A first electrode 110 is disposed on a side of the substrate 101 opposite to a side of the substrate 101 on which the active layer 102, n-side barrier layer 103, p-side barrier layer 104 and first and second cladding layers 105, 106 are disposed. A current injection ridge 111 is provided on the second cladding layer 106 and a second electrode 112 is disposed on this current injection ridge 111. The current injection ridge 111 extends along the length L of the laser 100. It is located centrally to the width W of the laser 100, but only extends across part of the width W. In other words, the current injection ridge 111 is narrower than the width W of the laser 100.

Figure 4:
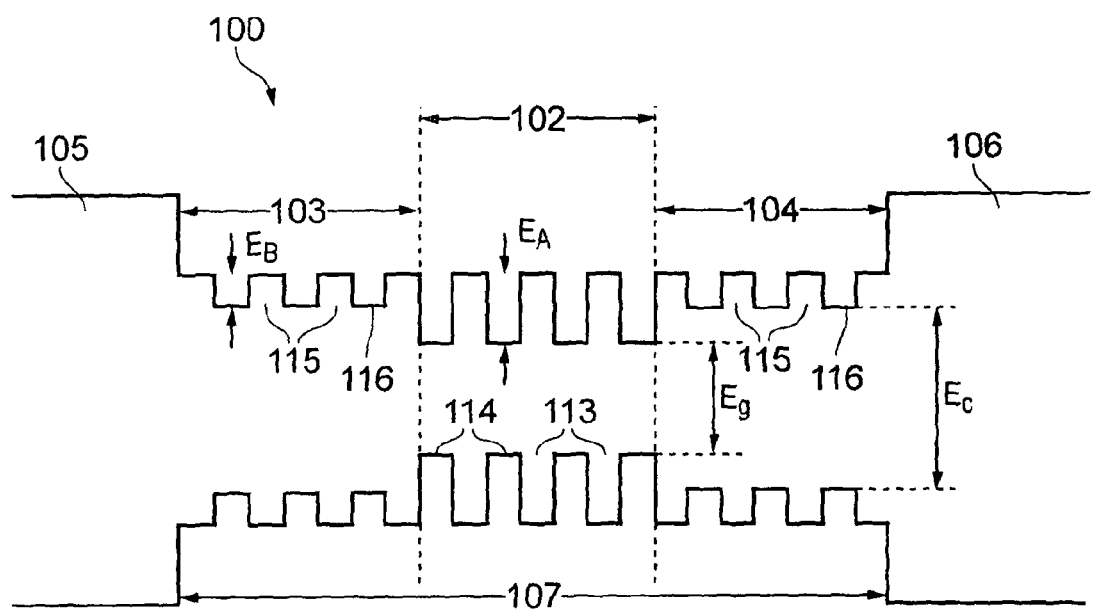
FIG. 4 is a schematic illustration of a band structure of the laser according to the first preferred embodiment.

As shown in FIG. 4, the active layer 102 comprises alternating layers 113, 114 of a first and second material, and the n-side barrier layer 103 and p-side barrier layer 104 each comprise alternating layers 115, 116 of the first material and a third material. The materials are selected such that the layers 114, 116 of the second and third materials form quantum wells between the layers 113, 115 of the first material. In this embodiment, the first material is Indium Gallium Arsenide Phosphide InGaAsP. More specifically, one suitable material is $In_{0.88}Ga_{0.12}As_{0.28}P_{0.72}$, where the numbers represent the relative proportions of atoms of the group III elements and the relative proportions of atoms of the group V elements respectively. The second material is selected to have an energy depth $E_A$ relative to the first material of 109 meV and a band gap $E_g$ appropriate for the lasing wavelength $\lambda=1.3$ μm. The third material is selected to have an energy depth $E_B$ relative to the first material of 21 meV. Thus, in the ideal case, where the energy depth $E_B$ is the same for the conduction band and the valance band, the band gap $E_C$ of the third material is 176 meV greater than the band gap $E_g$ of the second material. In another embodiment, the first material is $In_{0.84}Ga_{0.16}As_{0.36}P_{0.64}$, the second material is selected to have an energy depth $E_A$ relative to the first material of 156 meV, and the third material is selected to have an energy depth $E_B$ relative to the first material of 29 meV. For example, the third material may be selected to have different composition, defects or doping from the first material.

The active layer 102 comprises four layers 114 of the second material with three layers 113 of the first material between them. The n-side barrier layer 103 and the p-side barrier layer 104 each comprise four layers 115 of the first material with three layers 116 of the third material between them. The active layer 102 thus has four quantum wells and the n-side barrier layer 103 and the p-side barrier layer 104 each have three quantum wells. In the active layer 102, the four layers 114 of the second material are each 6 nm thick and the three layers 113 of the first material are each 10 nm thick. In the n-side barrier layer 103 and the p-side barrier layer 104, the four layers 115 of the first material are each 10 nm thick and the three layers 116 of the third material are each 15 nm thick. The total thickness of optical cavity 107 is therefore 224 nm.

In operation, a voltage is applied across the first and second electrodes 110, 112. This causes electrons to migrate from the first electrode 110 and holes to migrate from the second electrode 112, into the optical cavity 107. In the optical cavity 107, the electrons and holes recombine.

Some of the electrons and holes recombine across the band gap $E_g$ of the layers 114 of the second material in the active layer 102. A proportion of these electrons and holes recombine in such a way as to emit a photon at the lasing wavelength λ. Such photons contribute to the light output by the laser 100. The remainder of the electrons and holes that recombine across the band gap $E_g$ of the of the layers 114 of the second material recombine in processes such as non-radiative Auger recombination and non-radiative recombination via defects, or recombine to emit photons having wavelength different to the lasing wavelength λ due to thermal broadening. These effects represent a loss in the efficiency of the laser 100, as the electrons and holes recombine across the band gap $E_g$ of the layers 114 of the second material without emitting photons at the lasing wavelength λ.

Others of the electrons and holes recombine across the band gap $E_C$ of the layers 116 of the third material in the n-side barrier layer 103 and the p-side barrier layer 104. As this band gap $E_C$ is larger than the band gap $E_g$ of the second material, photons emitted by such recombination have a shorter wavelength than the lasing wavelength λ. Again, they do not therefore contribute to the lasing process within the optical cavity 107.

The processes that result in electrons and holes recombining across the band gap $E_g$ of the second material without emitting photons at the lasing wavelength λ are temperature dependent, increasing with increasing temperature of the optical cavity 107. As these processes increase, the proportion of the electrons and holes that recombine across the band gap $E_g$ of the second material in such a way as to emit a photon at the lasing wavelength λ decreases. However, the ratio of electrons and holes that recombine across the band gap $E_g$ of the second material to electrons and holes that recombine across the band gap $E_C$ of the third material increases with increasing temperature of the optical cavity 107. So, the increasing ratio can compensate for the decreasing proportion as the temperature of the optical cavity 107 increases.

Figure 5:
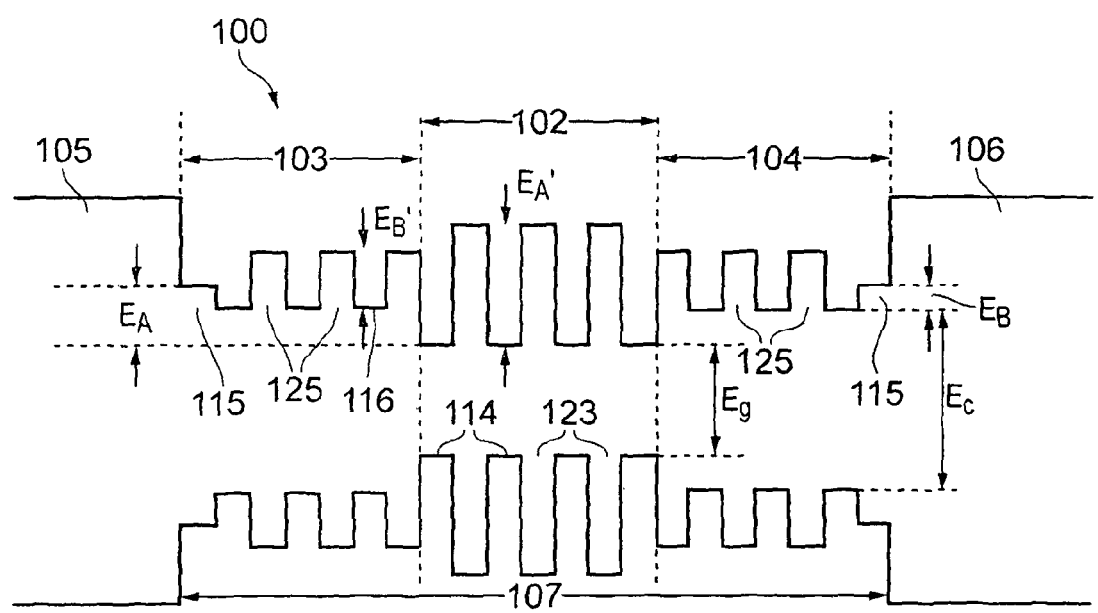
FIG. 5 is a schematic illustration of a band structure of a laser according to a second preferred embodiment.

Referring to FIG. 5, a laser 100 according to a second preferred embodiment is similar to the laser 100 of the first preferred embodiment, with the same reference numerals being used for like features, except that the layers 113 of the first material of the active layer 102 and some of the layers 115 of the first material of the n-side and p-side barrier layers 103,104 are replaced with layers 123, 125 of fourth and fifth materials respectively.

In more detail, the active layer 102 comprises alternating layers 123, 114 of the fourth and second materials. Specifically, the active layer 102 comprises four layers 114 of the second material with three layers 123 of the fourth material between them. Whilst the energy depth $E_A$ of the second material relative to the first material remains the same as in the first embodiment, the energy depth $E_A'$ of the second material relative to the fourth material is different. In this embodiment, the energy depth $E_A'$ of the second material relative to the fourth material is greater than the energy depth $E_A$ of the second material relative to the first material.

The n-side barrier layer 103 and the p-side barrier layer 104 each comprise alternating layers 125, 116 of the fifth material and the third material adjacent to one layer 115 of the first material. The layer 115 of the first material in the n-side barrier layer 103 is between the first cladding layer 105 and a layer of 116 of the third material. Likewise, the layer 115 of the first material in the p-side barrier layer 104 is between the second cladding layer 106 and a layer 116 of the third material. There are three layers 125 of the fifth material alternating with three layers 116 of the third material. Again, whilst the energy depth $E_B$ of the third material relative to the first material remains the same as in the first embodiment, the energy depth $E_B'$ of the third material relative to the fifth material is different. In this embodiment, the energy depth $E_B'$ of the third material relative to the fifth material is greater than the energy depth $E_B$ of the third material relative to the first material.

It should also be noted that differences between the fourth and fifth materials mean that the energy depth $E_A'$ of the second material relative to the fourth material is different to it's energy depth relative to the fifth material. This difference, as well as the greater energy depths $E_A'$, $E_B'$ of the second and third materials introduced by the layers 125, 126 of the fourth and fifth materials, make it harder for electrons and holes to migrate between the different layers 114, 116 of the second and third materials. This can improve temperature stability even further, particularly at around room temperature.

Figure 6:
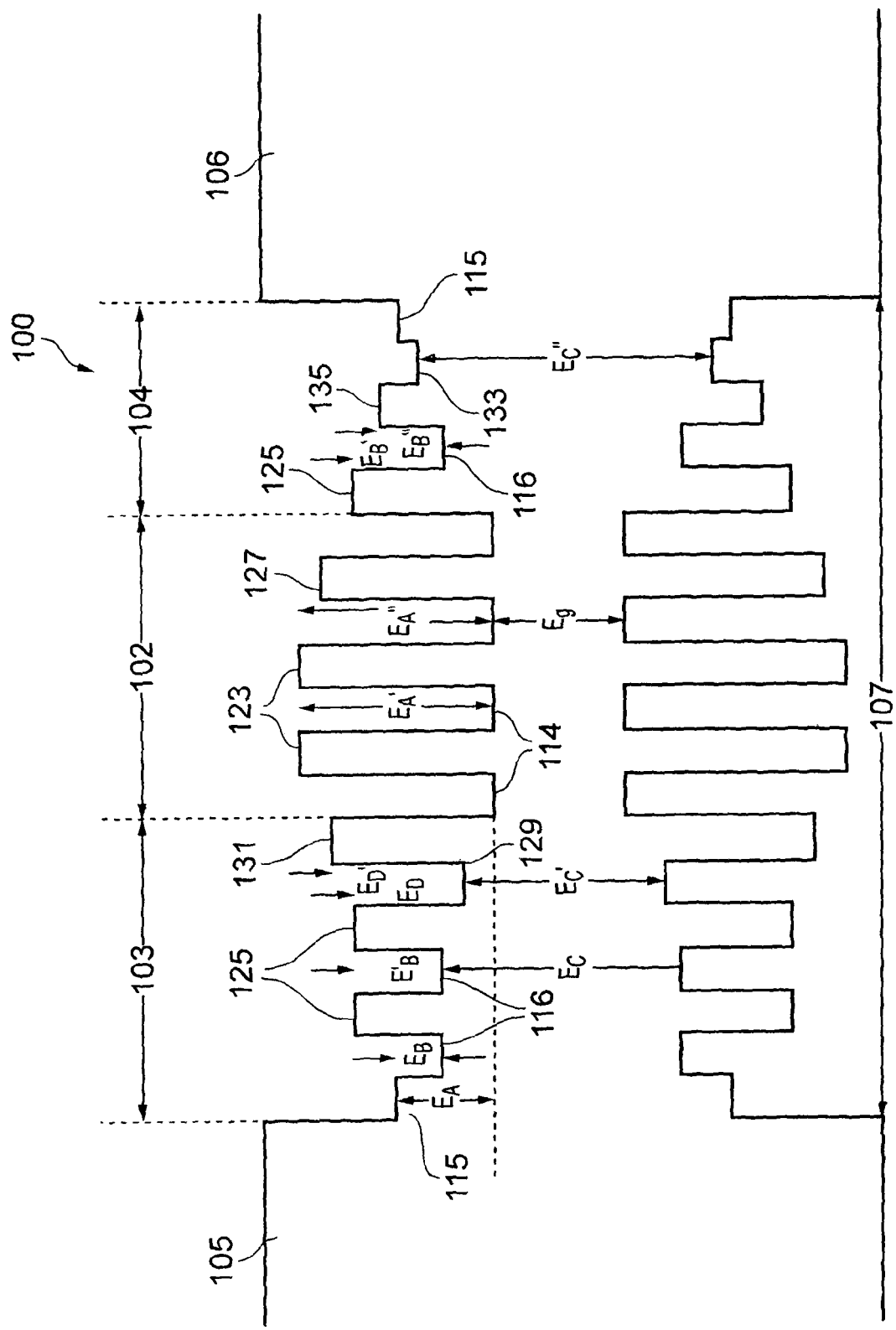
FIG. 6 is a schematic illustration of a band structure of a laser according to a third preferred embodiment.

Referring to FIG. 6, a laser 100 according to a third preferred embodiment is similar to the laser 100 of the second preferred embodiment, with the same reference numerals being used for like features, except that: in the active layer 102, one of the layers 123 of the fourth material of the active layer 102 is replaced with a layer 127 of a sixth material; in the n-side barrier layer 103, one of the layers 116 of the third material is replaced with layer 129 of a seventh material and one of the layers 125 of the fifth material is replaced with a layer 131 of an eighth material; and, in the p-side barrier layer 104, one of the layers of the third material 116 is replaced with a layer 133 of a ninth material, one of the layers 125 of the fifth material is replaced with a layer 135 of a tenth material, and both another of the layers 116 of the third material and another of the layers 125 of the fifth material are removed.

In this embodiment, the layer 127 of the sixth material in the active layer 102 is closer to the p-side barrier layer 104 than the n-side barrier layer 103. In this embodiment, the layer 127 of the sixth material is spaced apart from the p-side barrier layer 104 by a layer 114 of the second material and is spaced apart from the n-side barrier layer 103 by three layers 114 of the second material and two layers 123 of the fourth material. The second material has an energy depth $E_A''$ with respect to sixth material different to its energy depth $E_A'$ with respect to the fourth material. In this embodiment, the energy depth $E_A''$ with respect to the sixth material is less than the energy depth $E_A$40 with respect to the fourth material. This makes it easier for electrons and holes to escape from the layers 114 of the second material adjacent to the layer 127 of the sixth material.

The layers 129, 131 of the seventh and eighth materials in the n-side barrier layer 103 are together adjacent to the active layer 102. In this embodiment, the layer 129 of the seventh material is spaced apart from the active layer 102 by the layer 131 of the eighth material. The seventh material has a bandgap $E_C'$ less than the band gap $E_C$ of the third material. This means that, at lower temperatures, more electrons and holes recombine across the bandgap $E_C'$ of the seventh material than across the bandgap $E_C$ of the third material, but this difference decreases with increasing temperature. The seventh material also has an energy depth $E_D'$ with respect to the eighth material that is different to its energy depth $E_D$ with respect to the fifth material. As there is a layer 131 of the eighth material between the layer 129 of the seventh material and the active region 102, this means that, at lower temperatures, it is harder for electrons and holes to migrate from the layer 129 of the seventh material to the active region 102 than to elsewhere in the n-side barrier layer 103.

The layers 133, 135 of the ninth and tenth materials in the p-side barrier layer 104 are together adjacent to the layer 115 of the first material. In this embodiment, the layer 135 of the tenth material is spaced apart from the layer 115 of the first material by the layer 133 of the ninth material. Removal of one of the layers 116 of the third material and one of the layers 125 of the fifth material means that the p-side barrier layer 104 and n-side barrier layer 103 are asymmetric. This can lead to electrons and holes migrating through the laser 100 differently from one another. The ninth material has a bandgap $E_C''$ greater than the band gap $E_C$ of the third material. This means that, at lower temperatures, less electrons and holes recombine across the bandgap $E_C''$ of the ninth material than across the bandgap $E_C$ of the third material, but this difference decreases with increasing temperature. The third material has an energy depth $E_B''$ with respect to the tenth material that is different to its energy depth $E_B'$ with respect to the fifth material. As there is a layer 125 of the fifth material between the only remaining layer 116 of the third material and the active region 102, and a layer 135 of the tenth material on the other side of the layer 116 of the third material, this means that, at lower temperatures, it is harder for electrons and holes to migrate from the layer 116 of the third material to the active region 102 than to elsewhere in the p-side barrier layer 104.

The band gaps $E_g$, $E_C$, $E_C'$, $E_C''$ of the second, third, seventh and ninth materials, the energy depths $E_A$, $E_B$ of the second and third materials relative to the first material in the first embodiment, the energy depths $E_A$, $E_B$, $E_A'$, $E_B'$ of the second and third materials relative to the first, fourth and fifth materials in the second embodiment, the energy depths $E_A''$, $E_D$, $E_D'$, $E_B''$ of the second, seventh and third materials relative to the first, fifth, eighth and tenth materials, as well as the dimensions and number of the layers 113, 114, 115, 116, 123, 125, 127, 129, 131, 133, 135 of the active layer 102, n-side barrier layer 103 and p-side barrier layer 104 can be selected so as to optimise the compensation depending on the application. The dimensions and number of the layers 116, 129, 133 of the third seventh and ninth materials affect the size of the ratio of electrons and holes that recombine across the band gap $E_g$ of the second material to electrons and holes that recombine across the band gaps $E_C$, $E_C'$, $E_C''$ of the third, seventh and ninth materials at a given temperature of the optical cavity 107. The energy depths $E_B$, $E_B'$, $E_B''$ of the third material and the energy depths $E_D$, $E_D'$ of the seventh material affect the rate at which the ratio changes with temperature. The energy depths $E_B$, $E_B'$, $E_B''$ of the third material and the energy depths $E_D$, $E_D'$ of the seventh material are of the same order of magnitude as kT over the range of temperatures at which the laser 100 is intended to operate, where k is Boltzmann's constant and T is the temperature of the optical cavity 107. In particular, the energy depth $E_B'$ of the third material relative to the fifth material is approximately 10 kT over the range of temperatures at which the laser 100 is intended to operate. As a result, electrons and holes become thermally excited out of the third material and can transfer instead to the second material before recombining.

In a variant of the first, second and third preferred embodiments, different ones of the layers 116 of the third material in the n-side barrier layer 103 and p-side barrier layer 104 have different dimensions or different band gaps $E_C$ or energy depths $E_B$ $E_B'$. Indeed, the third material may be more than one different material, with different materials being used in different ones of the layers 116. This means that they each affect the ratio differently at different temperatures.

Figure 7:
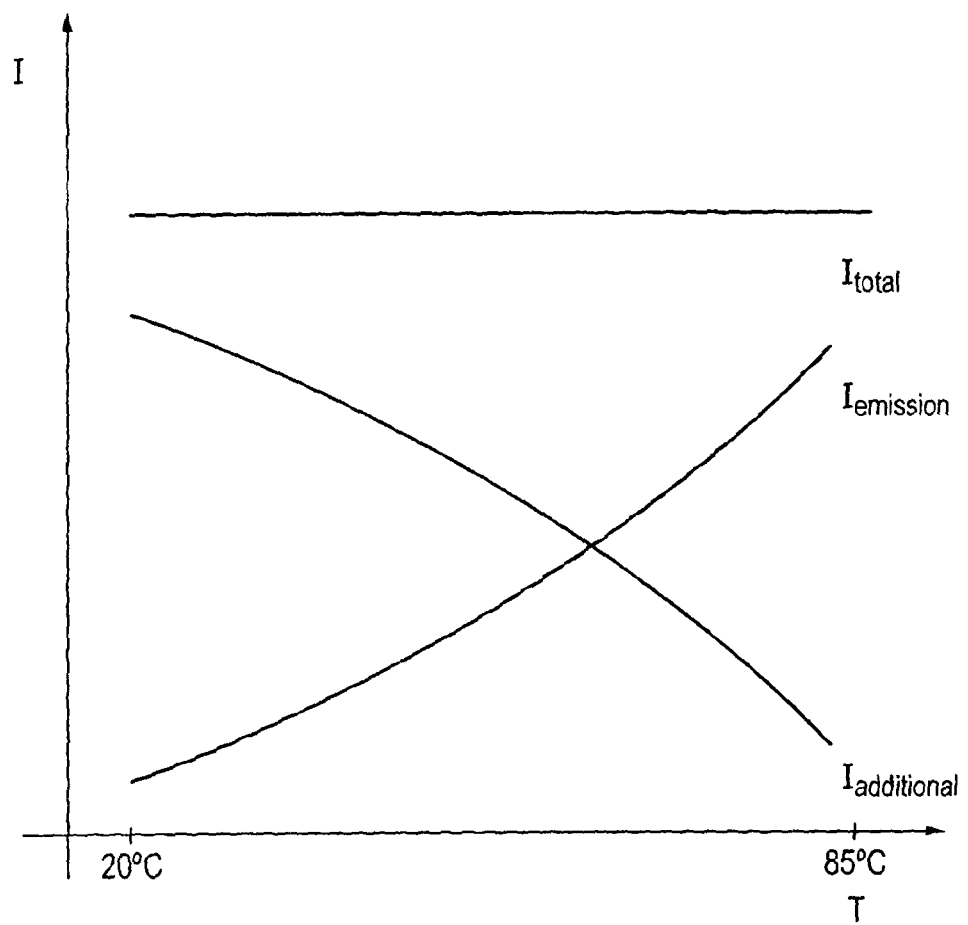
FIG. 7 is a graph showing electrical current in the laser according to the first, second or third preferred embodiments.

Referring to FIG. 7, it is typically desirable for a SCH edge emitting semiconductor laser that outputs light at 1.3 μm to be operable in a temperature range from 20° C. to 85° C. Across this temperature range, a current $I_{active}$ flows through the active layer 102 due to electrons and holes recombining across the band gap $E_g$ of the second material. In order to maintain a constant light output across the desired temperature range, this current $I_{active}$ increases with temperature, as the proportion of electrons and holes that recombine to emit photons at the lasing wavelength λ decreases. An additional current $I_{additional}$ flows through the n-side barrier layer 103 and p-side barrier layer 104 due to electrons and holes recombining across the band gap $E_C$ of the third material. This additional current $I_{additional}$ decreases with temperature, as the ratio of electrons and holes that recombine across the band gap $E_C$ of the third material to electrons and holes that recombine across the band gap $E_g$ of the second material decreases. Ideally, the laser 100 can be designed such that a total current $I_{total}=I_{active}+I_{additional}$ remains constant across the desired temperature range. The total current $I_{total}$ corresponds with the current that needs to be supplied to the laser 100 to generate a light output of a given power. By designing the laser 100 to allow this current to be constant across the temperature range of interest, the need to control the temperature of the laser 100 or to use complex drive circuitry to vary the current supplied to the laser 100 to maintain a light output of constant power at different temperatures can be simplified or dispensed with.

Figure 8:
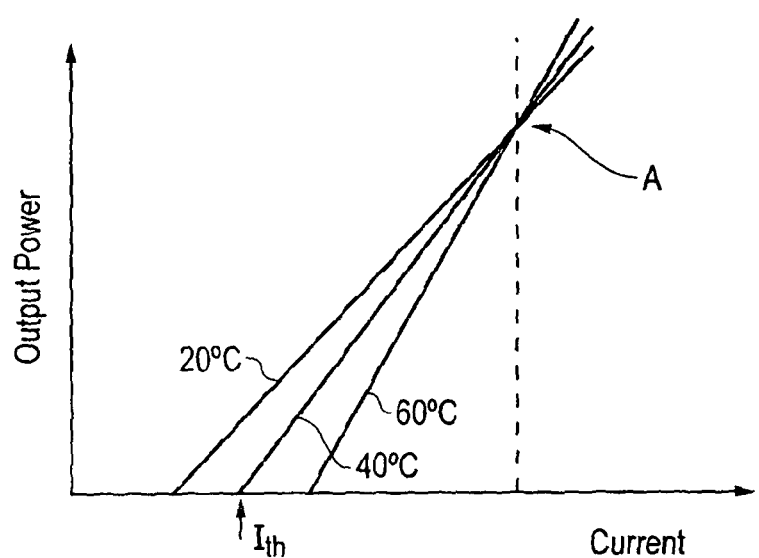
FIG. 8 is a graph showing the relationship between output power and input current in the laser according to the first, second or third preferred embodiments at various temperatures over the range 20-60° C.

Referring to FIG. 8, in other applications, only the optical power of the light output by the laser 100 when a fixed input current is supplied to the laser 100 needs to be the same at different temperatures, with the light output when the current supplied to the laser 100 is at different levels being less important. It will be appreciated that the fixed input current is a particular or predetermined level of the current supplied to the laser 100. So, the current supplied to the laser 100 may vary. For example, the current supplied to the laser 100 may vary cyclically and the fixed input current may be the level of the current supplied to the laser 100 at a particular time in the cycle. For the present purposes, the fixed current may therefore be described as constant, although the current supplied to the laser itself need not remain so.

In these applications, the threshold current $I_{th}$ of the laser 100 can be allowed to increase across the range of temperatures at which the laser 100 is intended to operate, as in the prior art. The slope efficiency is then modified so as to increase with increasing temperature, rather than decrease, by selecting the appropriate energy depth $E_B$ of the third material or materials. By controlling the rate of increase of the slope efficiency with temperature appropriately, the optical power of the light output at the constant fixed input current, illustrated by point A in FIG. 8, can be kept the same. Effectively the same result can be achieved for a slope efficiency that decreases with increasing temperature, by having the threshold current also decrease with increasing temperature. In order to have the threshold current decrease with increasing temperature, the increasing ratio of electrons and holes that recombine across the band gap $E_g$ of the second material to electrons and holes that recombine across the band gap $E_C$ of the third material overcompensates for the decreasing proportion of electrons and holes that recombine across the band gap $E_g$ of the second material to emit photons at the lasing wavelength, as the temperature of the optical cavity 107 increases. Typically, the fixed input current is two or more times greater than the threshold current of the laser 100.

In the temperature range 20° C. to 85° C., the threshold current of the laser 100 may increase with temperature by a factor of two or three. In other words, the proportion of the electrons and holes that recombine across the band gap $E_g$ of the second material in such a way as to emit a photon at the lasing wavelength λ decreases by a factor of two or three. So, typically, at a lower end of the range of temperatures at which the laser 100 is intended to operate, electrons and holes recombine across the band gap $E_g$ of the second material at the same or a lower rate than they recombine across the band gap $E_C$ of the third material. In other words, the ratio of electrons and holes that recombine across the band gap $E_g$ of the second material to electrons and holes that recombine across the band gap $E_C$ of the third material is 1:1. This allows the ratio to increase sufficiently to compensate for the decreasing proportion over the temperature range of interest. Ideally, at a higher end of the range of temperatures at which the laser 100 is intended to operate, substantially no electrons and holes recombine across the band gap $E_C$ of the third material. This minimises the total current $I_{total}$ that needs to be applied to the laser 100.

Figure 9:
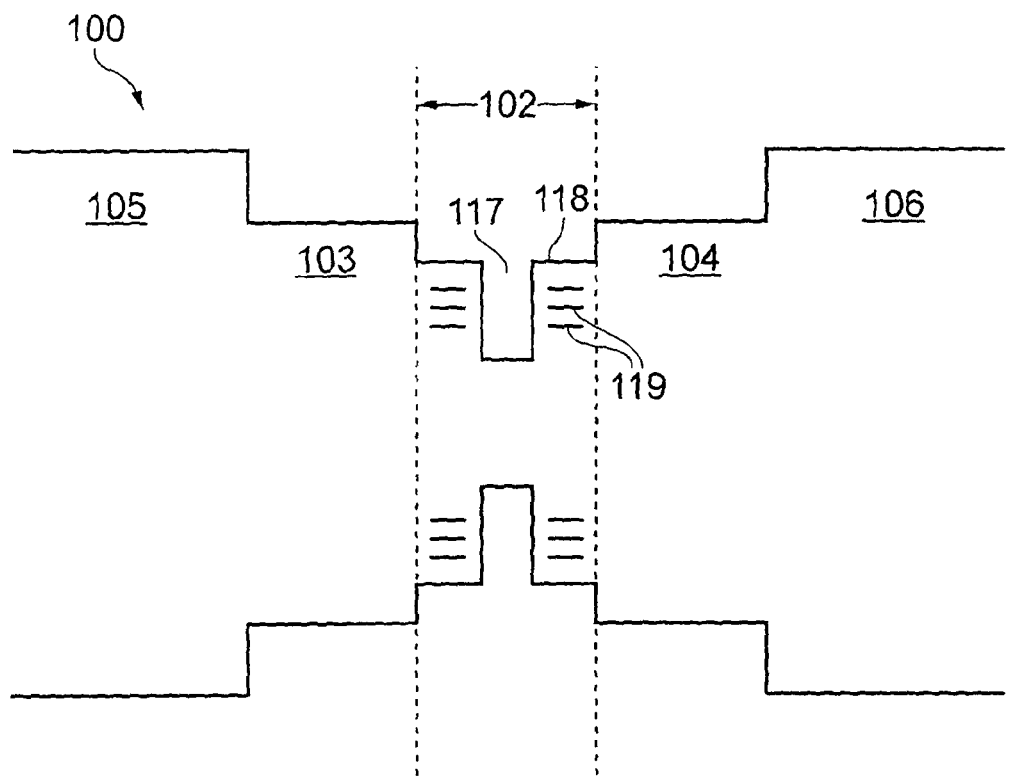
FIG. 9 is a schematic illustration of a band structure of a laser according to a fourth preferred embodiment.

Referring to FIG. 9, a laser 100 according to a fourth preferred embodiment is similar to the laser 100 of the first, second or third preferred embodiments, with the same reference numerals being used for like features, except that the n-side barrier layer 103 and p-side barrier layer 104 are each uniform layers of an eleventh material and the active layer 102 is a layer 117 of a twelfth material sandwiched by two layers 118 of a thirteenth material. The two layers 118 of the eleventh material are provided with material fluctuations in the form of layers 119 of quantum dots. These quantum dots provide a functional equivalent to the layers 116 of the third material in the first, second and third preferred embodiments. In particular, they have a band gap $E_C$ and energy depths $E_B$, $E_B$40 equivalent to those of the layers 116 of the third material in the first, second and third preferred embodiments.

Figure 10:
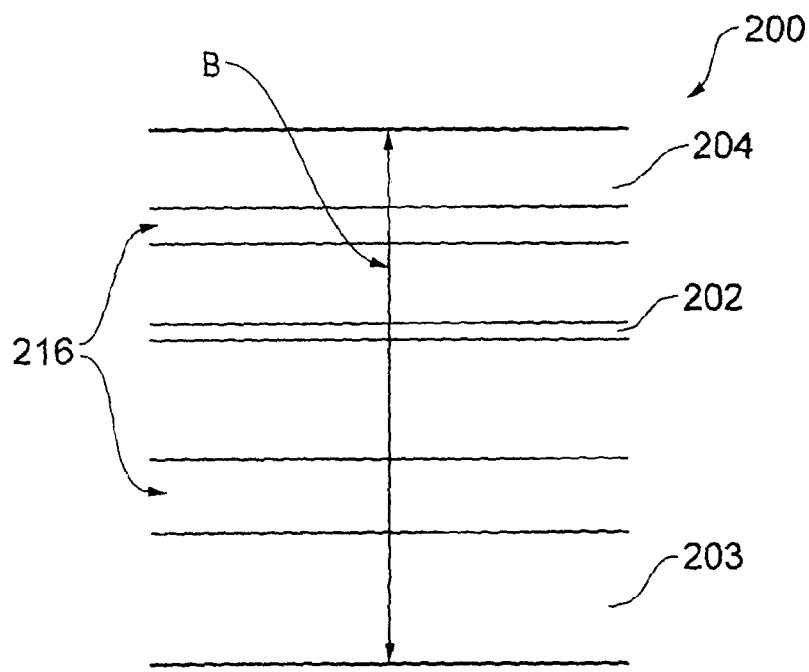
FIG. 10 is a schematic illustration a laser according to a fifth preferred embodiment.

Referring to FIG. 10, a laser 200 according to a fifth preferred embodiment is a Vertical Cavity Surface Emitting Laser (VCSEL). The laser 200 has an active layer 202 disposed between an n-side barrier layer 203 and a p-side barrier layer 204. The n-side barrier layer 203 and a p-side barrier layer 204 each sandwich a respective additional layer 216. The principles of design and operation of the laser 200 according to the fifth preferred embodiment are similar to those of the laser 100 according to the first, second and third preferred embodiments, except that the direction B of light propagation in the laser 200 according to the fifth preferred embodiment is normal to the layers 202, 203, 204, 216. In particular, the additional layers 216 are equivalent to the layers 116 of the third material in the laser 100 according to the first, second and third preferred embodiments.

Although in the embodiments described above the active layers 102, 202, n-side layers 103, 203 and p-side layers 104, 204 comprise InGaAsP, these layers 102, 202, 103, 203, 104, 204 and the lasers 100, 200 more generally may comprise other materials. In particular other group III-V semiconductors or a group IV semiconductor may be used. Examples include InGaAsP, InGaAsSb and InGaN The embodiments described above also refer to a lasing wavelength of 1.3 µm, this being a wavelength typically used in optical communications and hence being of commercial value. However, in other embodiments, the lasers 100, 200 have different lasing wavelengths λ. Examples include 0.5 µm, 1.55 µm and mid Infra Red (IR) wavelengths, such as 3 µm.

The lasers 100, 200 have also been described as being a SCH edge emitting semiconductor laser or a Vertical Cavity Surface Emitting Laser (VCSEL). However, in other embodiments, the laser 100, 200 have a different structure. Particular examples include a Distributed Feedback (DFB) laser or tunable laser.

Other variations and modifications will be apparent to the skilled person. Such variations and modifications may involve equivalent and other features that are already known and may be used instead of, or in addition to, features described herein. Features that are described in the context of different embodiments may be provided in combination in a single embodiment. Conversely, features that are described in the context of a single embodiment may also be provided separately or in any suitable sub-combination.

It should be noted that the term "comprising" does not exclude other elements or steps, the term "a" or "an" does not exclude a plurality, a single feature may fulfill the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A semiconductor laser operable to output light at a lasing wavelength in response to supply of an electrical current, the semiconductor laser having an optical cavity comprising:

an active region with a first band gap arranged such that a proportion of electrons and holes that recombine across the first band gap recombine to emit photons at the lasing wavelength, the proportion decreasing with increasing temperature of the optical cavity;

and an additional structure with one or more additional band gaps, the first and one or more additional band gaps being arranged such that a ratio of electrons and holes that recombine across the first band gap to electrons and holes that recombine across the one or more additional band gaps increases with increasing temperature of the optical cavity, wherein, over a range of temperatures at which the semiconductor laser is intended to operate, the increasing ratio compensates for the decreasing proportion so as to reduce change with temperature of the optical cavity in the rate at which electrons and holes recombine across the first band gap to emit photons at the lasing wavelength.

2. The semiconductor laser of claim 1, wherein, over the range of temperatures at which the semiconductor laser is intended to operate, the increasing ratio compensates for the decreasing proportion such that there is substantially no change with temperature of the optical cavity in the rate at which electrons and holes recombine across the first band gap to emit photons at the lasing wavelength.

3. The semiconductor laser of claim 1, wherein, over the range of temperatures at which the semiconductor laser is intended to operate, the increasing ratio compensates for the decreasing proportion so as to reduce change with temperature of the optical cavity in a threshold current at which the electrical current supplied to the semiconductor laser is sufficient to cause lasing in the optical cavity.

4. The semiconductor laser of claim 3, wherein, over the range of temperatures at which the semiconductor laser is intended to operate, the increasing ratio compensates for the decreasing proportion such that there is substantially no change with temperature of the optical cavity in the threshold current.

5. The semiconductor laser of claim 1, wherein, over the range of temperatures at which the semiconductor laser is intended to operate, the increasing ratio compensates for the decreasing proportion so as to reduce change with temperature of the optical cavity in the optical power of light output by the semiconductor laser when a fixed electrical current is supplied to the semiconductor laser.

6. The semiconductor laser of claim 5, over the range of temperatures at which the semiconductor laser is intended to operate, the increasing ratio compensates for the decreasing proportion such that there is substantially no change with temperature of the optical cavity in the optical power of the light output by the semiconductor laser when the fixed electrical current is supplied to the semiconductor laser.

7. The semiconductor laser of claim 5, wherein the constant fixed electrical current is two more times greater than a/the threshold current (at which the electrical current applied to the semiconductor laser sufficient to cause lasing in the optical cavity).

8. The semiconductor laser of claim 1, wherein, at a lower end of the range of temperatures at which the semiconductor laser is intended to operate, the ratio is 1:1 or less.

9. The semiconductor laser of claim 1, wherein, at a higher end of the range of temperatures at which the semiconductor laser is intended to operate, substantially no electrons and holes recombine across the one or more additional band gaps.

10. The semiconductor laser of claim 1, wherein the additional structure is a localised variation in composition, defects or doping of a material of the optical cavity.

11. The semiconductor laser of claim 1, wherein the optical cavity comprises a barrier region and the additional structure has an energy depth with respect to the barrier region that is of the same order of magnitude as kT or more over the range of temperatures at which the semiconductor laser is intended to operate, where k is Boltzmann's constant and T is the temperature of the optical cavity.

12. The semiconductor laser of claim 1, wherein the additional structure comprises one or more quantum wells.

13. The semiconductor laser of claim 12, wherein the quantum wells are bounded by barriers, at least one of which barriers provides at least one of the quantum wells with an energy depth relative to that barrier different to the energy depth of that quantum well relative to another of the barriers.

14. The semiconductor laser of claim 13, wherein the energy depth provided by the at least one barrier is approximately 10kT over the range of temperatures at which the semiconductor laser is intended to operate (where k is Boltzmann's constant and T is the temperature of the optical cavity).

15. The semiconductor laser of claim 1, wherein
the additional structure comprises one or more layers of quantum dots.

16. The semiconductor laser of claim 1, wherein the active region comprises one or more quantum wells.

17. The semiconductor laser of claim 16, wherein the quantum wells of the active region are bounded by barriers, at least one of which barriers provides at least one of the quantum wells of the active region with an energy depth relative to that barrier different to the energy depth of that quantum well relative to at least one (of the) barrier(s) bounding the(a) quantum well(s) of the additional structure.

18. The semiconductor laser of claim 17, wherein the energy depth relative to the at least one barrier of the active region is greater than the energy depth relative to the at least one barrier of the additional structure.

19. The semiconductor laser of claim 1, wherein the range of temperatures at which the semiconductor laser is intended to operate is from around 20° C. to around 85° C.

20. The semiconductor laser of claim 1, wherein the optical cavity comprises InGaAsP.

21. The semiconductor laser of claim 1, wherein the lasing wavelength is approximately 1.3 µm.

* * * * *